(12) United States Patent
Shum et al.

(10) Patent No.: US 10,693,054 B2
(45) Date of Patent: Jun. 23, 2020

(54) MTJ BOTTOM METAL VIA IN A MEMORY CELL AND METHOD FOR PRODUCING THE SAME

(71) Applicant: GLOBALFOUNDRIES Singapore Pte. Ltd., Singapore (SG)

(72) Inventors: Danny Pak-Chum Shum, Caspian (SG); Wanbing Yi, Singapore (SG); Curtis Chun-I Hsieh, Singapore (SG); Yi Jiang, Singapore (SG); Juan Boon Tan, Singapore (SG); Benfu Lin, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/046,648

(22) Filed: Jul. 26, 2018

(65) Prior Publication Data
US 2020/0035906 A1 Jan. 30, 2020

(51) Int. Cl.
*H01L 27/00* (2006.01)
*H01L 43/02* (2006.01)
*H01L 43/12* (2006.01)
*H01L 27/22* (2006.01)

(52) U.S. Cl.
CPC ............ *H01L 43/02* (2013.01); *H01L 27/222* (2013.01); *H01L 43/12* (2013.01)

(58) Field of Classification Search
None
See application file for complete search history.

(56) References Cited

U.S. PATENT DOCUMENTS

| 6,812,040 B2 | 11/2004 | Kyler et al. | |
| 9,704,919 B1 | 7/2017 | Lu et al. | |
| 2006/0039185 A1* | 2/2006 | Braun | G11C 11/15 365/158 |
| 2015/0325622 A1* | 11/2015 | Zhang | H01L 43/12 257/421 |
| 2018/0025765 A1* | 1/2018 | Yokoyama | G11C 11/1697 365/158 |

* cited by examiner

*Primary Examiner* — Reema Patel
(74) *Attorney, Agent, or Firm* — Ditthavong & Steiner, P.C.

(57) ABSTRACT

A method of forming a memory cell with a high aspect ratio metal via formed underneath a metal tunnel junction (MTJ) and the resulting device are provided. Embodiments include a device having a metal via formed underneath a metal tunnel junction (MTJ) in a memory cell, and the metal via has an aspect ratio smaller than 2.

11 Claims, 4 Drawing Sheets

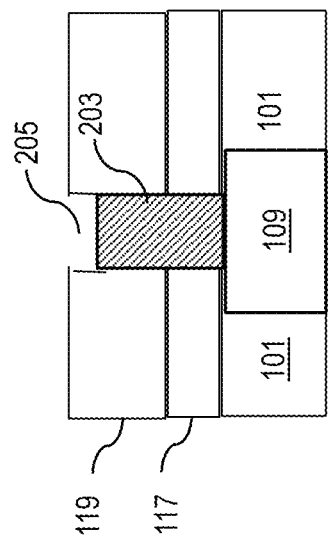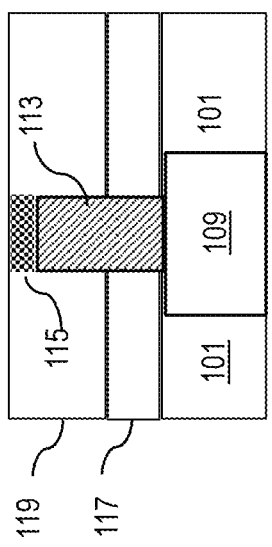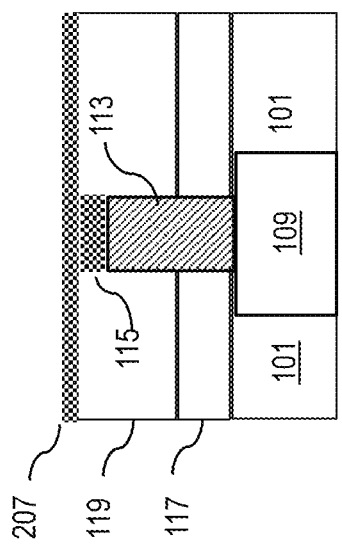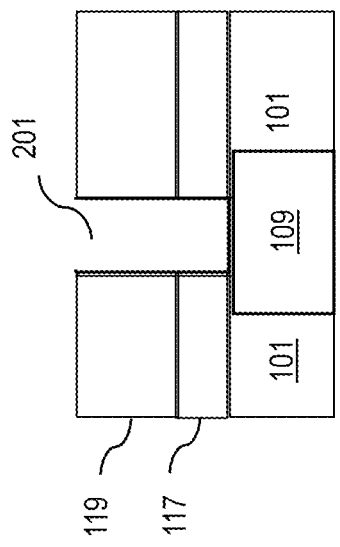

MTJ BOTTOM METAL VIA IN A MEMORY CELL AND METHOD FOR PRODUCING THE SAME

TECHNICAL FIELD

The present disclosure relates to semiconductor fabrication. In particular, the present disclosure relates to the formation of a metal via underneath a metal tunnel junction (MTJ) in a memory cell within a magnetic random-access memory (MRAM) device.

BACKGROUND

Memory devices such as MRAM have been continuously scaled down in size to accommodate complex device requirements and low power consumption demands. However, the smaller form factor has also increased the complexity of memory device fabrication. Critical dimensions (CD) of memory cells are smaller in back-end-of-line (BEOL) process variations. A particular area of challenge faced by manufacturers is to form a pillar-shaped conductor being a MTJ stack/structure in MRAM accurately and consistently into a desired shape or surface type due to limited process margin.

Etching of a MTJ may cause sidewall erosion, resulting in tapering of the pillar contact tip instead of formation of a square tip (flat, uniform contact surface), since known MTJ etch involves physical bombardment from noble gas. More metal via filling materials are re-sputtered during MTJ etch thus re-deposited along the sidewall of MTJ, which causes the FL and the magnetically fixed (pinned) layer partial shorted through the tunneling barrier layer.

A need therefore exists for cost effective methodology enabling formation of a MTJ bottom metal via in a memory cell having more etch time for over-etching thereby physically removing re-deposited sidewall materials, and the resulting device.

SUMMARY

One aspect of the present disclosure is a device including a tall and thin MTJ bottom metal via in a memory cell within a MRAM device.

An aspect of the present disclosure is a method of cost effectively forming a tall and thin MTJ bottom metal via in a memory cell within a MRAM device.

According to the present disclosure, some technical effects may be achieved in part by a device including a metal via formed underneath a MTJ in a memory cell, and the metal via has an aspect ratio smaller than 2.

Another aspect of the present disclosure is a MRAM device including: a first metal interconnecting layer in a memory cell of the MRAM, an interlayer dielectric (ILD) formed over the first metal interconnecting layer, a metal via formed in the ILD, and a MTJ formed over the metal via. A second metal interconnecting layer is formed underneath the metal via. The first and second metal interconnecting layers are formed of copper (Cu), and the first metal interconnecting layer has a higher pitch density than the second metal interconnecting layer. The metal via has an aspect ratio smaller than 2, and the metal via is either a pillar made of tungsten (W), or a two-level structure made of TaN having a top level smaller than a bottom level.

A further aspect of the present disclosure is a method including: forming a metal via in an ILD in a memory cell, and forming an MTJ over the metal via. The metal via has an aspect ratio smaller than 2.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A through 2E schematically illustrate cross-sectional views of a process flow for forming an MTJ bottom metal via in a memory cell within a MRAM device, in accordance with an exemplary embodiment;

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problems of etching an MTJ between to metal interconnecting layers in a memory cell, such as erosion of the MTJ sidewalls. The problems are solved, inter alia by forming a high AR metal via underneath the MTJ in the memory cell.

Methodology in accordance with embodiments of the present disclosure includes forming a metal via in an interlayer dielectric (ILD) in a memory cell, and forming a metal tunnel junction (MTJ) over the metal via. The metal via has an aspect ratio smaller than 2.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
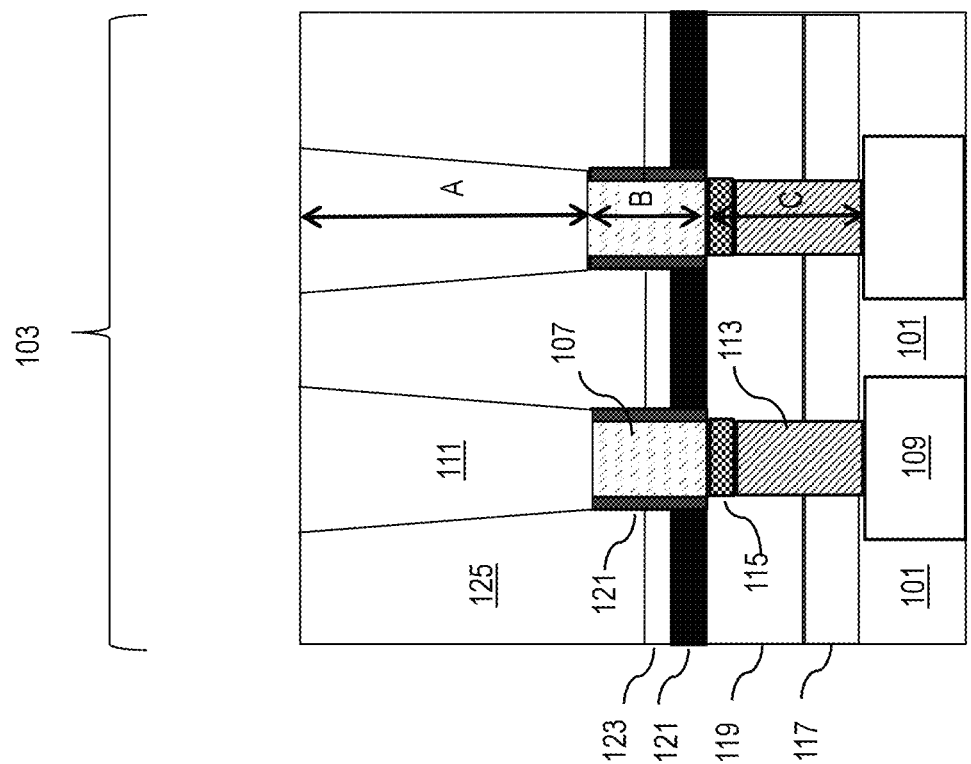
FIG. 1 schematically illustrates a cross-sectional view of a MTJ bottom metal via in a memory cell within a MRAM device, in accordance with one exemplary embodiment.

FIG. 1 schematically illustrates a cross-sectional view of an MTJ bottom metal via in a memory cell within a MRAM device, in accordance with one exemplary embodiment. Typically, a metal via bottom interconnect is formed of Cu or TaN. However, Cu can cause explosion or being blown apart. In addition, Cu may be out-diffused from weak interface. TaN is non-conformal, leaves a void in the metal via, and has a low AR. Therefore, this exemplary embodiment uses W to form a tall and thin MTJ bottom metal via in a memory cell with a high AR.

A MRAM device may include a plurality of interlayer dielectric (ILD) layers or levels. The number of ILD levels may depend on, for example, design requirements or the logic process involved. A metal level of an ILD may be referred to as Mi, where i is from 1 to x and is the i-th ILD level of x ILD levels. A contact level of an ILD level may be referred to as Vi−1, where i is the i-th ILD level of x ILD levels. Referring to FIG. 1, an interlayer dielectric (ILD) 101 is formed with a dense memory region 103 and an adjacent isolated or less dense logic region 105 (not shown for illustrative convenience).

One or more metal layers M1 to Mlast ("109") are formed in ILD 101 and above a transistor, while M1 is the lowest metal layer closet to the transistor and in the most dense arrangement, e.g., 1× pitch, and Mlast is the highest metal layer closet to MTJ 107 and in a less dense arrangement, e.g., 1.1× pitch. ILD 101 is formed of, e.g., of a low-K material such as SiCOH or any similar ILD material.

MTJ 107 is formed between Mlast layer 109 and metal layer 111, e.g., formed of Cu. In one embodiment, metal layer 111 has a wider pitch than Mlast layer 109. For example, metal layer 111 is 1.1× pitch, while Mlast layer 109 is 2.2× pitch. For example, in a 22 nm CMOS node, 1.1× of 90 nm pitch equals to 45 lines, 45 spaces in nm, while 1.1× of 80 nm pitch equals to 40 lines, 40 spaces in nm. On the other hand, 2.2× of 90 nm pitch equals to 90 lines, 90 spaces in nm. Additional metal connection layers (not shown for illustrative convenience) are then formed above metal layer 111 with even wider pitches than 2.2×, such as 9×, 11×, 34×, etc. The metal layers farther away from the transistor have wider pitches.

MTJ 107 may include a magnetically fixed (pinned) layer, one or more tunneling barrier layers and a magnetically free layer (FL), while the fixed layer includes a magnetic layer and a pinning layer. The bottom most layer of MTJ 107 is optionally coupled to a bottom electrode while the top most layer of MTJ 107 is coupled to a bit line (BL) or a metal interconnect layer connecting to BL. The free layer and the fixed layer may be formed of cobalt-iron-boron (CoFeB) alloys or cobalt iron (CoFe) based composite material, and the tunneling barrier layer may be magnesium oxide (MgO) or aluminum oxide ($Al_2O_3$). The pinning layer may be formed of platinum manganese (PtMn) alloy or iridium manganese (IrMn) alloy. The bottom electrode (BE) may be formed of titanium (Ti), titanium nitride (TiN), tantalum (Ta), tantalum nitride (TaN), or other suitable metals used in the semiconductor process A tall and thin MTJ bottom metal via 113, e.g., formed of W, is formed underneath MTJ 107. In one embodiment, MTJ bottom metal via 113 is shaped as a column. In another embodiment, MTJ bottom metal via 113 is shaped as a pillar with a top wider than the bottom. Referring to FIG. 1, a depth/height "A" of metal layer 111 is about 170 nm, a depth/height "B" of MTJ 107 is about 90 nm, and a depth/height "C" of MTJ bottom metal via 113 is about 80-160 nm. An optional metal layer 115 may also be formed, e.g., of TaN, over MTJ bottom metal via 113, as a bottom electrode (BE) of MTJ 107.

A silicon carbon nitride (SiCN) layer 117 and an oxide layer 119 are formed over ILD 101. A spacer layer 121 is formed, e.g., of silicon nitride (SiN) or any suitable encapsulation material, over and along sidewalls of MTJ 107 and over hard mask layer 117. It is noted that no contact point formed atop MTJ 107 as a top electrode (TE) in FIG. 1. An adhesion/initial liner layer for ULK 123 is formed over oxide layer 119 and covered by an ultra-low k (ULK) layer 125.

FIGS. 2A through 2E schematically illustrate cross-sectional views of a process flow for forming an MTJ bottom metal via in a memory cell within a MRAM device, in accordance with exemplary embodiments. Forming a tall and thin MTJ bottom metal via in a memory cell within a memory device requires a high aspect ratio (AR) fill process.

Referring to FIG. 2A, ILD 101 is formed of a dielectric material, such as tetraethyl orthosilicate (TEOS) or silicon oxide by chemical vapor deposition (CVD). Other suitable dielectric materials and forming techniques may also be useful. The thickness of ILD 101, for example, is about 160 nm. Other suitable thickness dimensions may also be useful.

A via 201 is formed in the memory region 103 using a hard mask formed over ILD 101, and a photoresist layer formed, e.g., of a spin-on material, over the hard mask layer. In one embodiment, a near-frictionless carbon (NFC) layer, a low temperature oxide (LTO) layer, and a bottom antireflective coating (BARC) layer are (all three not shown for illustrative convenience) may also be formed over ILD 101 or the hard mask layer, or respectively, prior to forming the photoresist layer. The hard mask layer is formed of, e.g., oxide, and the photoresist layer is formed of, e.g., nitride. Thereafter, anisotropic etch, such as RIE, is applied through oxide layer 119 and down to SiCN layer 117, to expose Mlast layer 109 below. In one embodiment, Via 201 is aligned, e.g., vertically, above Mlast 109. Thereafter, the remaining photoresist layer is removed in the memory region 103. Other suitable removal process may also be employed.

Via 201 includes a sufficient depth to serve as an alignment trench which provides adequate topography which is used for aligning and defining subsequently formed layers, such as MTJ bottom metal via 113.

Referring to FIG. 2B, via 201 is filled with a conductive layer, such as W, to form a W interconnect 203 which becomes MTJ bottom metal via 113. A conductive layer of Ti, for example, may be formed by physical vapor deposition (PVD), a TiN liner is formed by CVD, and then a W liner is filled in by CVD. When W is used as a conductive layer, deposited by means of CVD for which WF6 is used, the TiN serves as a barrier to prevent chemical reactions between Ti and F which is formed during the CVD process. In one embodiment, an integrated PVD and CVD process is used to deposit conformal titanium/titanium nitride (Ti/TiN) liner/barrier films before depositing via 201 of a W-carbon film. As the film is primarily W, it behaves as a nucleation substrate for bulk W. The total thickness of interface films is therefore thin, thus enlarging the volume available for W fill. A planarization process, such as CMP, is performed to remove excess conductive materials, leaving a top of MTJ bottom metal via 113 at a top level of oxide layer 119.

As depicted in FIG. 2C, a top of W interconnect 203 is etched to provide a recess 205 of about 44 nm depth, for example using photolithography. As depicted in FIG. 2D, a TiN layer id deposited in recess 205 to form metal layer 115 over MTJ bottom metal via 113. Another planarization process, such as CMP, is performed to reach the top level of oxide layer 119 yet leaving excess conductive material, e.g., W, about 300 Å. The development of W recess costs extract time and money, yet W fills gaps better.

As depicted in FIG. 2E, a TaN layer 207, e.g., about 10 nm, is deposited over metal layer 115 and oxide layer 119 using PVD, and following with a planarization process, such as CMP, to remove excess TaN. In one embodiment, TaN layer 207 is left in the structure. In another embodiment, TaN layer 207 is removed using an optional TU CMP. The profile roughness parameter Rq (root mean squared) or Ra (arithmetical mean deviation) before TaN CMP is in a range of about 4 Å to about 5 Å under an atomic force microscope (AFM), and becomes smaller than 1.5 Å across wafer post TaN CMP within via overall.

Figure 3C:
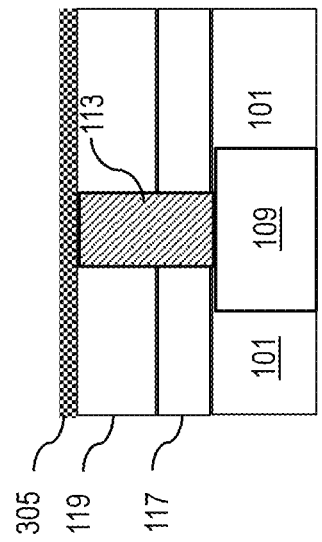
FIGS. 3A through 3C schematically illustrate cross-sectional views of a process flow for forming an MTJ bottom metal via in a memory cell within a MRAM device, in accordance with another exemplary embodiment.
Figure 3A:
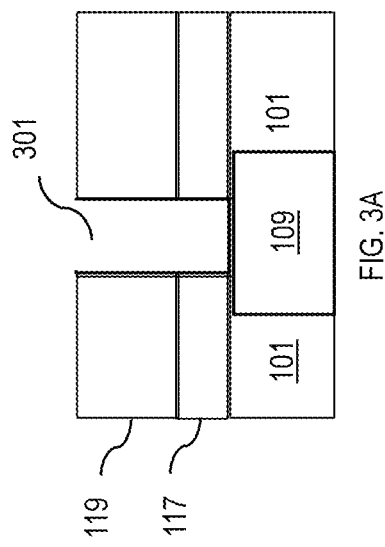
Figure 3B:
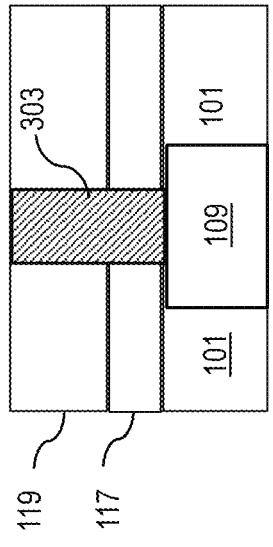

FIGS. 3A through 3C schematically illustrate cross-sectional views of a process flow for forming an MTJ bottom metal via in a memory cell within a MRAM device, in accordance with other exemplary embodiments. FIG. 3A to FIG. 3B apply processing similar to FIG. 2A to FIG. 2B. Referring to FIG. 3A, via 301 is formed in the memory region 103 using the same NFC+LTO+PR+BARC process. Thereafter, anisotropic etch, such as RIE, is applied through oxide layer 119 and down to SiCN layer 117, to expose Mlast layer 109 below. Referring to FIG. 3B, via 301 is filled with a conductive layer, such as W, to form a W interconnect 303 which becomes MTJ bottom metal via 113. A planarization process, such as CMP, is performed on the structure to reach the top level of oxide layer 119 without leaving excess conductive material of about 300 Å as in FIG. 2D.

As depicted in FIG. 3C, this embodiment skips etching a top of W interconnect 203 so there is no a trench 205 formed as in FIG. 2C. Instead, a TaN layer 305, e.g., about 30 nm, is deposited over a top of MTJ bottom metal via 113 and oxide layer 119 using PVD. In this embodiment, no metal layer 115 is form as BE under the MTJ bottom metal via 113 as in FIG. 2D. In one embodiment, TaN layer 207 is left as about 30 nm in the structure. In another embodiment, TaN layer 207 becomes thinner (e.g., about 10 nm) using an optional TU CMP.

Figure 4:
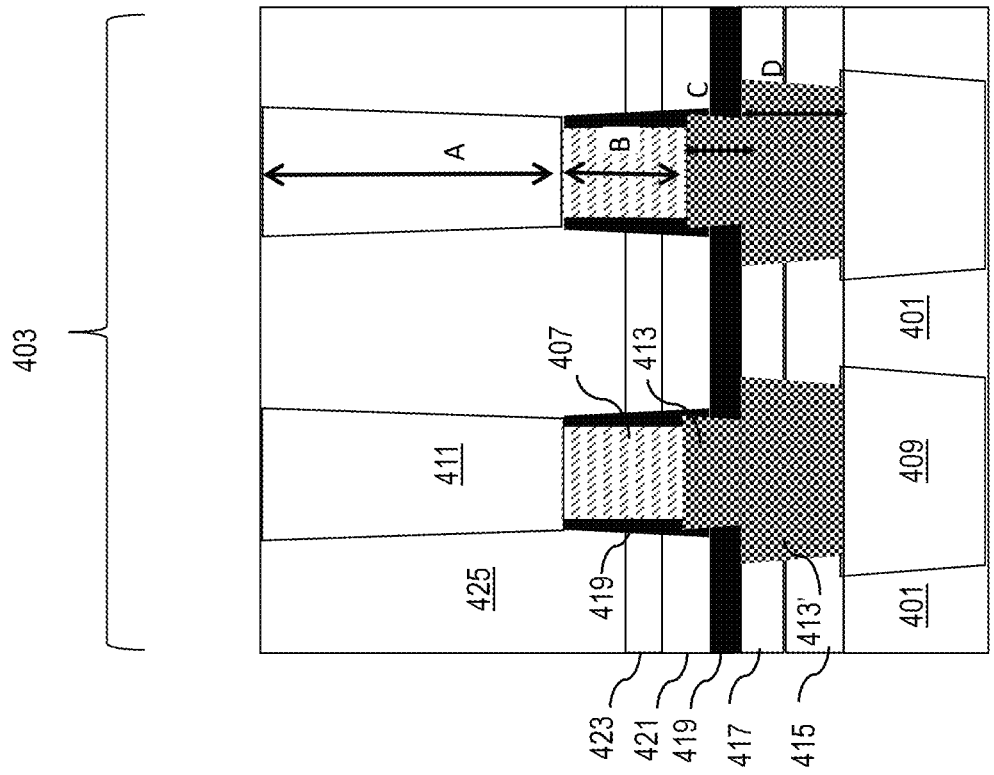
FIG. 4 schematically illustrates a cross-sectional view of an MTJ bottom metal via in a memory cell within a MRAM device, in accordance with an exemplary embodiment.

FIG. 4 schematically illustrates a cross-sectional view of an MTJ bottom metal via in a memory cell within a MRAM device, in accordance with another exemplary embodiment. Although a metal via bottom interconnect is formed of TaN is non-conformal, leaves a void in the metal via, and has a low AR, its processing post MTJ planarization is less challenging than forming a metal via bottom interconnect of W as in the embodiment of FIG. 1. Therefore, this exemplary embodiment uses two TaN layers to form a tall and thin MTJ bottom metal via in a memory cell with a high AR.

Referring to FIG. 4, an ILD 401 is formed with a dense memory region 403 and an adjacent isolated or less dense logic region 405 (not shown for illustrative convenience). One or more metal layers M1 to Mlast ("409") are formed in ILD 401 and above a transistor. Like in FIG. 1, while M1 is the lowest metal layer closet to the transistor and in the most dense arrangement, e.g., 1× pitch, and Mlast is the highest metal layer closet to MTJ 407 and in a less dense arrangement, e.g., 1.1× pitch. ILD 101 is formed of, e.g., of a low-K material such as SiCOH or any similar ILD material.

MTJ 407 is formed between Mlast layer 409 and metal layer 411, e.g., formed of Cu. In one embodiment, metal layer 411 has a wider pitch than Mlast layer 409. Additional metal connection layers (not shown for illustrative convenience) are then formed above metal layer 411 with even wider pitches. The metal layers farther away from the transistor have wider pitches.

As depicted in FIG. 4, a tall and thin MTJ bottom metal via is made of two layers 413 and 413', e.g., formed of TaN, underneath MTJ 407. In one embodiment, MTJ bottom metal via is shaped as a 2-level cake while both layers 413 and 413' having straight walls. In another embodiment, MTJ bottom metal via is shaped as a 2-level cake while each of the levels 413 and 413' having a top wider than the bottom.

With continued reference to FIG. 4, a depth/height "A" of metal layer 411 is about 140 nm, a depth/height "B" of MTJ 407 is about 90 nm, and a depth/height "C" of the top level 413 of MTJ bottom metal via is about 50 nm, and a depth/height "D" of the bottom level 413' of MTJ bottom metal via is about 70 nm. Top level 413 of MTJ bottom metal via also functions as a BE of MTJ 407.

A SiCN layer 415 and an oxide layer 417 are formed over ILD 401. A spacer layer 419 is formed, e.g., of SiN or any suitable encapsulation material, over and along sidewalls of MTJ 107, along sidewalls of bottom level 413' of MTJ bottom metal via, and over oxide layer 417. It is noted that no contact point formed atop MTJ 407 as a TE in FIG. 4. A ULK layer 421 is formed over nitride layer 419. An adhesion/initial liner 423 is formed over ULK layer 421, and Layer 423 is covered by another ULK layer 425.

The embodiments of the present disclosure can achieve several technical effects including providing a high aspect ratio metal via underneath a MTJ in a memory cell to avoid a free layer and a reference layer of the MTJ from being shorten through a sandwich layer of the MTJ. In addition, the high aspect ratio metal via provides more etch time for over-etching and physically removing re-deposition sidewall materials. Moreover, the thinner W (e.g., 35 nm-70 nm) via improves percentage bits and scalability, in comparison with a fat (e.g., 80 nm-120 nm) TaN via. The processes of forming the high aspect ratio metal via requires lower cost by removing CMP recess and reducing one TaN deposition and one CMP. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of semiconductor devices including MRAM.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   a metal via disposed underneath a metal tunnel junction (MTJ) in a memory cell;
   at least two metal interconnecting layers,
   wherein a first metal interconnecting layer is disposed over the MTJ, and a second metal interconnecting layer is disposed underneath the metal via, and
   wherein the metal via has an aspect ratio smaller than 2, and
   wherein the first metal interconnecting layer has a wider pitch than the second metal interconnecting layer.

2. The device according to claim 1, wherein the device is a magnetic random-access memory (MRAM) device.

3. The device according to claim 1, wherein the first and second metal interconnecting layers comprise copper (Cu).

4. The device according to claim 1, wherein the metal via comprises tungsten (W).

5. The device according to claim 1, wherein the metal via comprises tantalum nitride (TaN) and has a top level smaller than a bottom level.

6. The device according to claim 1, further comprising: a bottom electrode disposed between the MTJ and the metal via.

7. A method comprising:
   forming a metal via in an interlayer dielectric (ILD) in a memory cell;
   forming a metal tunnel junction (MTJ) over the metal via, wherein the metal via has an aspect ratio smaller than 2;
   forming a first metal interconnecting layer before forming the metal via, wherein the metal via is formed over the first metal interconnecting layer; and
   forming a second metal interconnecting layer over the MTJ,
   wherein the first metal interconnecting layer has a wider pitch than the second metal interconnecting layer.

8. The method according to claim 7, wherein the memory cell is formed in a magnetic random-access memory (MRAM) device.

9. The method according to claim 7, further comprising:
   forming a bottom electrode over the metal via, wherein the MTJ is disposed over the bottom electrode.

10. The method according to claim 7, wherein the metal via comprises tungsten (W).

11. The method according to claim 7, wherein the metal via comprises tantalum nitride (TaN) and has a top level smaller than a bottom level.

* * * * *